United States Patent
Kwok et al.

(10) Patent No.: US 9,411,683 B2
(45) Date of Patent: Aug. 9, 2016

(54) ERROR CORRECTION IN MEMORY

(71) Applicant: Intel Corporation, Santa Clara, CA (US)

(72) Inventors: Zion S. Kwok, Burnaby (CA); Andre Lei, Burnaby (CA); Scott Nelson, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 14/141,215

(22) Filed: Dec. 26, 2013

(65) Prior Publication Data

US 2015/0188570 A1     Jul. 2, 2015

(51) Int. Cl.
| | |
|---|---|
| *H03M 13/00* | (2006.01) |
| *G06F 11/10* | (2006.01) |
| *H03M 13/11* | (2006.01) |
| *H03M 13/37* | (2006.01) |
| *G06F 11/08* | (2006.01) |

(52) U.S. Cl.
CPC ............ *G06F 11/1076* (2013.01); *G06F 11/08* (2013.01); *H03M 13/1108* (2013.01); *H03M 13/1111* (2013.01); *H03M 13/3715* (2013.01)

(58) Field of Classification Search
CPC ............ H03M 13/45; H03M 13/1111; H03M 13/1108; H03M 1/1111; H03M 13/453; G06F 11/10
See application file for complete search history.

(56) References Cited

U.S. PATENT DOCUMENTS

| | | | | |
|---|---|---|---|---|
| 8,316,279 | B2 * | 11/2012 | Kim et al. ...................... | 714/763 |
| 2013/0055047 | A1 * | 2/2013 | Sharon et al. ................. | 714/764 |
| 2013/0283114 | A1 * | 10/2013 | Yang .................. | G11B 20/1833 |
| | | | | 714/752 |
| 2013/0297983 | A1 * | 11/2013 | Wang ..................... | H03M 13/47 |
| | | | | 714/752 |

OTHER PUBLICATIONS

Cho et al., Adaptive threshold technique for bit flipping decoding of low density parity check codes, Sep. 2010, IEEE, Comm. Letters, vol. 14, No. 9, pp. 857-859.*
Nguyen Two-Bit bit flipping decoding of LDPC codes, Mar. 2011, google.com, pp. 1 to 6 (retrieved on Sep. 29, 2015).*
Wu et al., Parallel weighted bit flipping decoding, Aug. 2007, IEEE, Comm. letters, vol. 11, No. 8, pp. 671 to 673.*
Johnson, S. J. & Weller, S. R., "Low-Density Parity-Check Codes: Design and Decoding", Encyclopedia of Telecommunications, Apr. 15, 2003, 33 pages, John Wiley & Sons, Inc.
Dung Viet Nguyen, et al., "Two-Bit Bit Flipping Decoding of LDPC Codes", Symposium, Jul. 31, 2011-Aug. 5, 2011, 6 pages, IEEE, St. Petersburg Russia.
Bane Vasic, et al., "Trapping Set Ontology", Conference, Sep. 30, 2009-Oct. 2, 2009, 7 pages, IEEE, Monticello, IL.

* cited by examiner

*Primary Examiner* — Shelly A Chase
(74) *Attorney, Agent, or Firm* — Thorpe North & Western, LLP

(57) ABSTRACT

Apparatus, systems, and methods for error correction in memory are described. In one embodiment, a memory controller comprises logic to load an error correction codeword retrieved from a memory and apply a first error correction decoder to decode the error correction codeword, wherein the first error correction decoder implements a bit-flipping error correction algorithm which utilizes a variable bit-flipping threshold to determine whether to flip a bit in an error correction codeword. Other embodiments are also disclosed and claimed.

22 Claims, 9 Drawing Sheets

ERROR CORRECTION IN MEMORY

TECHNICAL FIELD

The present disclosure generally relates to the field of electronics. More particularly, some embodiments of the invention generally relate to error correction in non-volatile memory for electronic devices.

BACKGROUND

Many electronic devices include memory systems that may be implemented using local, fast-access memory which is frequently embodied as a nonvolatile memory, e.g., flash memory or the like. The memory may include multiple memory devices, and data may be distributed across the multiple memory devices. Periodically, read errors may occur due to errors in the storage media (non-volatile memory) and/or errors in signal processing.

Accordingly, techniques to manage error correction in memory may find utility, e.g., in memory systems for electronic devices.

BRIEF DESCRIPTION OF THE DRAWINGS

The detailed description is provided with reference to the accompanying figures. The use of the same reference numbers in different figures indicates similar or identical items.

DESCRIPTION OF EMBODIMENTS

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

In some examples described herein the subject matter described herein addresses the issue of error correction in memory by providing a parity check decoder that stores stability information in association with results of parity check equations applied to codeword bits. Applying the notation of a Tanner graph, the parity check decoder stores stability information at each check node in association with the pass/fail result of parity check equations applied to codeword bits linked to the node. The stability information may be encoded in binary form and may reflect whether the result of the parity check equation has been changed due to a bit flip.

In a further aspect, the subject matter described herein addresses the issue of error correction in memory by providing a bit-flipping error correction algorithm which utilizes a variable bit flipping threshold, in which the threshold varies as a function of a syndrome weight, e.g., a sum of the pairs of check node bits and the stability bits. Thus, when the parity check decoder detects a high number of errors in the codeword bits on an initial iteration the syndrome weight is high. Accordingly, the bit flipping threshold is high such that the bit flipping algorithm makes fewer mistakes. By contrast, when the parity check decoder detects a low number of errors in the codeword bits on an initial iteration the syndrome weight is low. Accordingly, a low bit flipping threshold is used to make corrections more quickly, thereby reducing the decoding time.

Further details are described with reference to FIGS. 1-10, below.

Figure 1:
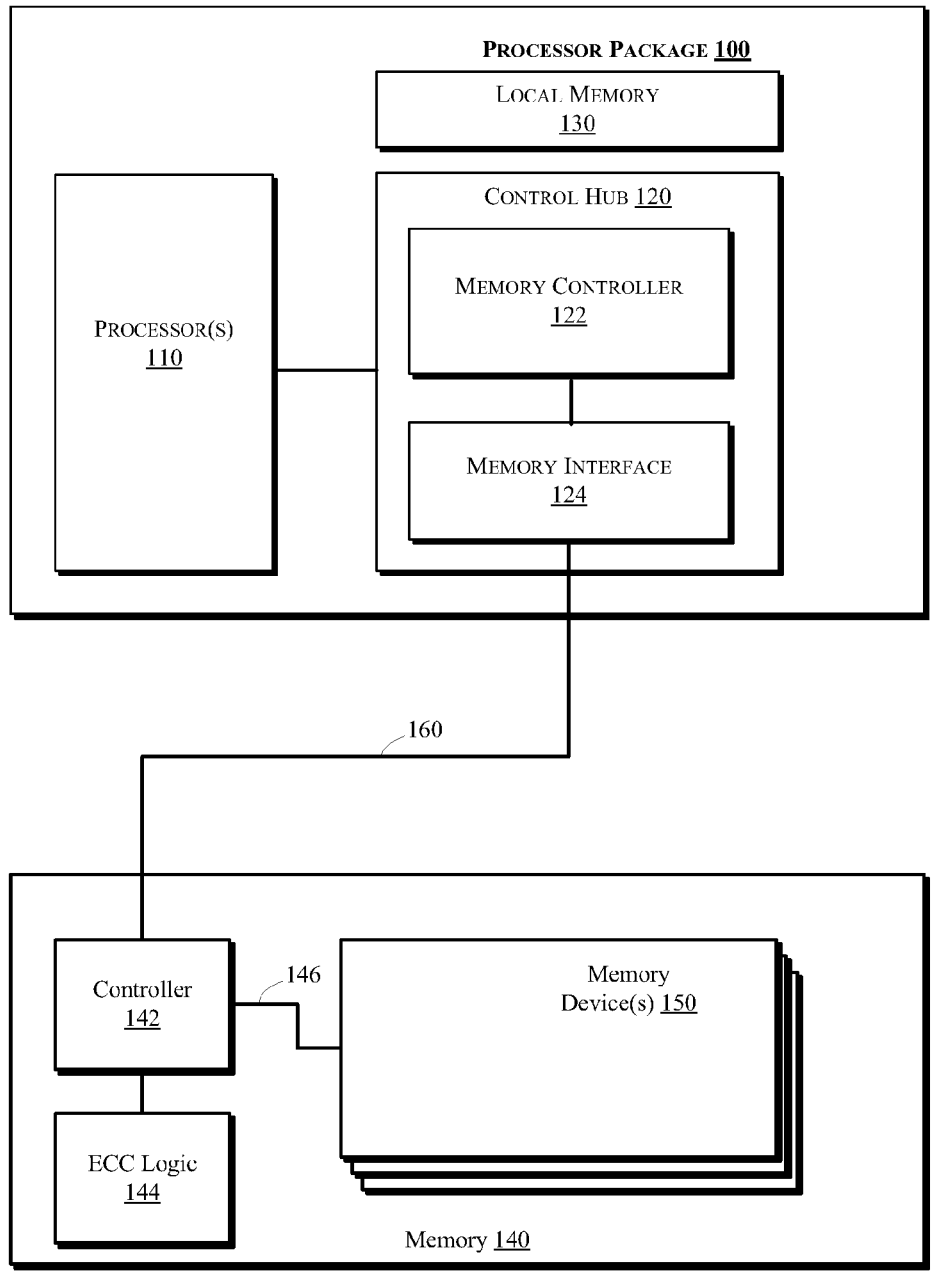
FIG. 1 is a schematic, block diagram illustration of components of apparatus to implement error correction in memory in accordance with various examples discussed herein.

FIG. 1 is a schematic, block diagram illustration of components of apparatus to implement error correction in memory in accordance with various examples discussed herein. Referring to FIG. 1, in some embodiments a central processor package 100 which may comprise one or more processors 110 coupled to a control hub 120 and a local memory 130. Control hub 120 comprises a memory controller 122 and a memory interface 124.

Memory interface 124 is coupled to a memory 140 by a communication bus 160. In some examples, the communication bus 160 may be implemented as traces on a printed circuit board, a cable with copper wires, a fibre optic cable, a connecting socket, or a combination of the above.

Memory 140 may comprise a controller 142, error correction control logic 144, and one or more memory device(s) 150. In various embodiments, at least some of the memory banks 150 may be implemented using volatile memory, e.g., static random access memory (SRAM), a dynamic random access memory (DRAM), or non-volatile memory, e.g., phase change memory, NAND (flash) memory, ferroelectric random-access memory (FeRAM), nanowire-based non-volatile memory, memory that incorporates memristor technology, three dimensional (3D) cross point memory such as phase change memory (PCM), or spin-transfer torque memory (STT-RAM). By way of example, in some embodiments the memory device(s) 150 may comprise one or more direct in-line memory modules (DIMMs) coupled to a memory channel 146 which provides a communication link to controller 142. The specific configuration of the memory device(s) 150 in the memory 140 is not critical.

Figure 2:
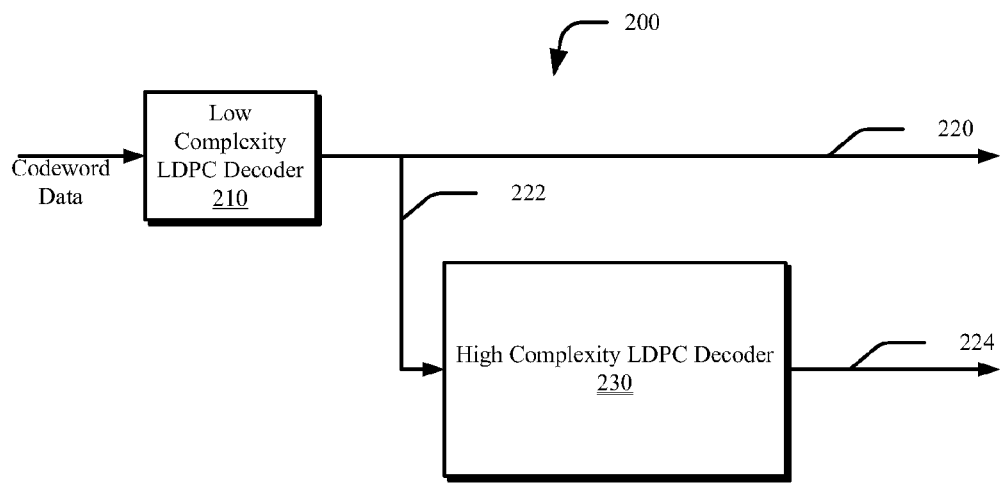
FIG. 2 is a schematic block diagram of an architecture of components of apparatus to implement error correction in memory in accordance with various examples discussed herein.

As described above, in some embodiments ECC logic 144, which may be coupled to controller 142 or integrated into controller 142 implements error correction in memory 140. FIG. 2 is a schematic block diagram of an architecture of components of apparatus to implement error correction in memory in accordance with various examples discussed herein. In some embodiments the apparatus 200 may be implemented within ECC logic 144.

Referring to FIG. 2, in some embodiments apparatus 200 comprises a low complexity low-density parity check (LDPC) decoder 210 and a high complexity LDPC decoder 230. Codeword data read from a memory (e.g., one or more memory devices 150 in memory 140) is applied to the low-complexity LDPC decoder 210. For example, the error correction codeword may be a low-density parity check (LDPC) code. If the LDPC decoder is successful in decoding the codeword data then the low-complexity LDPC decoder 210 outputs a signal on line 220 indicating that the codeword was successfully decoded. By contrast, if the low-complexity LDPC decoder 210 is unsuccessful in decoding the codeword data then the low-complexity decoder 210 outputs a signal on line 220 that indicates a decode failure. The codeword data may then be input to a high-complexity LDPC decoder 230, which makes further attempts to decode the codeword data. Similarly, high-complexity LDPC decoder 230 outputs a success/fail signal on line 224.

Figure 3:
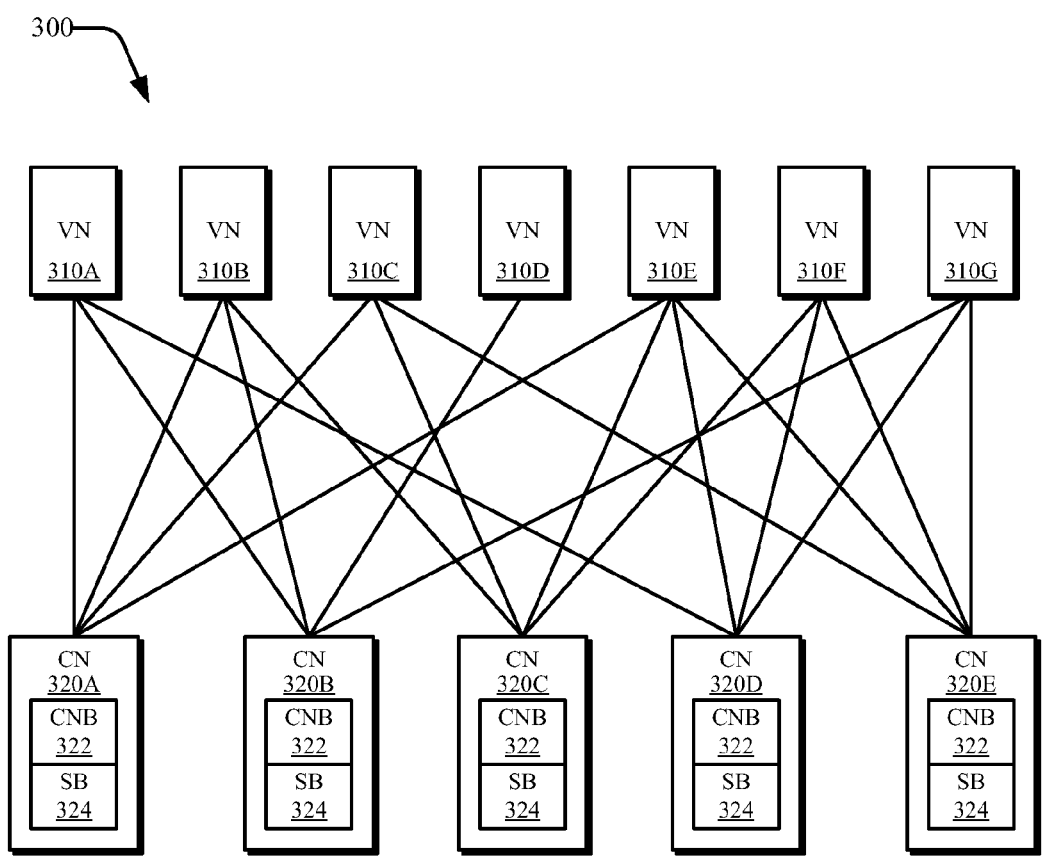
FIG. 3 is a Tanner Graph illustrating an architecture of a low-density parity check (LDPC) decoder in accordance with various examples discussed herein.

The subject matter described here focuses primarily on the low complexity LDPC decoder 210. In some examples a LDPC decoder may be represented by a Tanner graph. FIG. 3 is a Tanner Graph illustrating an architecture of a low-density parity check (LDPC) decoder in accordance with various examples discussed herein.

Referring to FIG. 3, codeword data may be loaded into a plurality of variable nodes indicated by reference numerals 310A, 310B, 310C, 310D, 310E, 310F, 310G, which may be referred to collectively herein by reference numeral 310. For example, the respective variable nodes 310 may comprise codeword bits obtained from memory in a read operation. Check nodes 320A, 320B, 320C, 320D, 320E, which may be referred to collectively herein by reference numeral 320, each comprise one or more parity check equations. Each check node 320 maintains both check node information, which may be in the form of a check node bit (CNB) 322 and stability information, which may be in the form of a stability bit (SB) 324.

In operation, the codeword bits in variable nodes 310 are subjected to one or more parity check equations associated with the respective check nodes 320. If the parity check equation associated with a check node 320 passes then the check node bit may be assigned a binary zero (0). By contrast, if the parity check equation associated with a check node 320 fails then the check node bit may be assigned a binary one (1).

The stability information (e.g., stability bits 324) are initialized to a value that is equal to its associated check node bit, which is used to signify a stable value. Stability bits 324 may be changed from a stable value (i.e. equal to the check node bit), to an unstable value (i.e. different from the check node bit), when a codeword bit in a variable node 310 subjected to the parity check equations in a check node 320 is flipped by a bit flipping error correction algorithm, as illustrated in Table I, below.

TABLE I

| Original Bits (CNB, SB) | Flipped Bits (CNB, SB) | Meaning |
|---|---|---|
| 0, 0 | 1, 0 | Stable 0 to Unstable 1 |
| 0, 1 | 1, 0 | Unstable 0 to Unstable 1 |
| 1, 0 | 0, 1 | Unstable 1 to Unstable 0 |
| 1, 1 | 0, 1 | Stable 1 to Unstable 0 |

Thus, the maintenance of stability information in the respective check nodes 320 allows the decoder to associate a stability value with the check node bits stored in the respective check nodes 320. For example, a check node bit may be characterized as either a stable or unstable pass (0) or a stable or unstable fail (1), as illustrated in Table II, below.

TABLE II

| Bits (CNB, SB) | Integer Representation | Meaning |
|---|---|---|
| 0, 0 | 0 | Stable 0 |
| 0, 1 | 1 | Unstable 0 |
| 1, 0 | 2 | Unstable 1 |
| 1, 1 | 3 | Stable 1 |

Having described components and an architecture to implement error correction in memory, operations to implement error correction in memory will now be described with reference to FIGS. 4-5. In some examples the operations depicted in FIGS. 4-5 may be implemented by the low complexity LDPC decoder 210, alone or in combination with controller 142.

Figure 4:
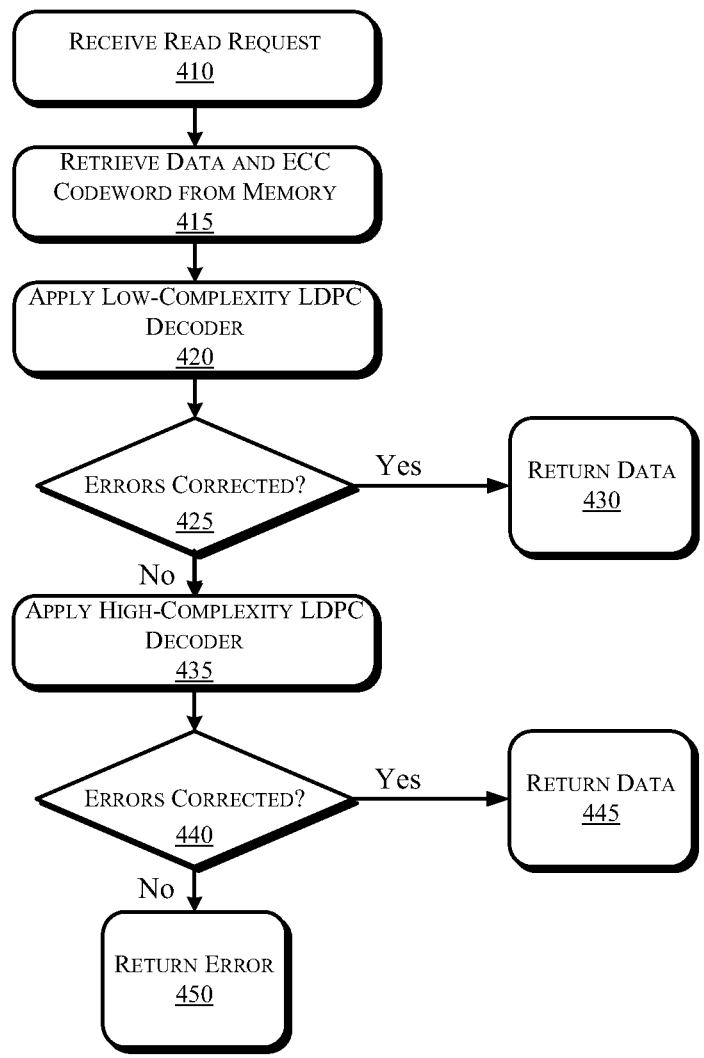
FIGS. 4 and 5 are flowcharts illustrating operations in a method to implement error correction in memory accordance with various embodiments discussed herein.

Referring first to FIG. 4, at operation 410 a read request is received and at operation 415 data and an associated ECC codeword are retrieved from memory. For example, referring briefly to FIG. 1, in some examples a read operation may be received in controller 142 from memory controller 122 via memory interface 124. In response to the read operation the controller 142 may retrieve data and an ECC codeword from memory device(s) 150 in memory 140.

At operation 420 the codeword data retrieved from memory device(s) 150 in memory 140 is input to the low-complexity LDPC decoder 210. At operation 425 it is determined whether the low-complexity LDPC decoder 210 was successful at correcting any read errors in the codeword data. If, at operation 425 the low-complexity LDPC decoder 210 was successful in correcting any errors in the codeword data then control passes to operation 430 and the controller 142 may return the data retrieved from memory device(s) 150 in memory 140.

By contrast, if at operation 425 the low-complexity LDPC decoder 210 was unsuccessful at correcting read errors in the codeword data then control passes to operation 435 and the codeword data retrieved from memory device(s) 150 in memory 140 is input to the high-complexity LDPC decoder 230. At operation 440 it is determined whether the high-complexity LDPC decoder 230 was successful at correcting any read errors in the codeword data. If, at operation 440 the high-complexity LDPC decoder 230 was successful in correcting any errors in the codeword data then control passes to operation 445 and the controller 142 may return the data retrieved from memory device(s) 150 in memory 140.

By contrast, if at operation 440 the high-complexity LDPC decoder 230 was unsuccessful at correcting read errors in the codeword data then control passes to operation 450 and the controller 142 may return a read error signal to the memory controller 122.

Figure 5:
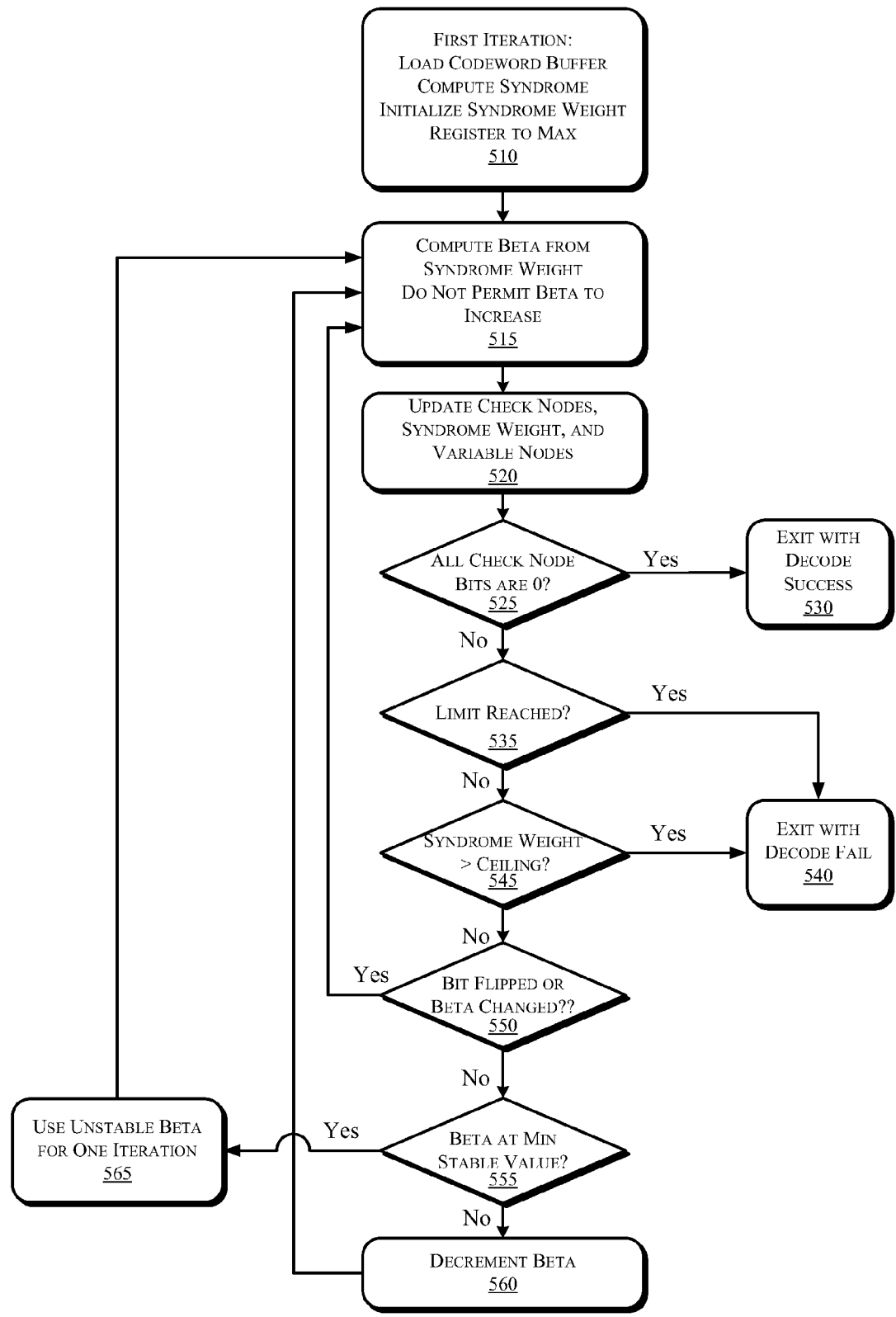

FIG. 5 is a flowchart illustrating operations implemented by low-complexity LDPC decoder 210. As described briefly above, low-density LDPC decoder 210 implements an iterative decoding algorithm that uses a variable bit flipping threshold which varies as a function of the sum of the check node bits 322 and the stability bits 324, referred to herein as the syndrome weight.

Referring to FIG. 5, at operation 510 the codeword data is loaded into a codeword buffer which may correspond to the variable nodes 310 depicted in FIG. 3. The codeword bits in variable nodes 310 are subjected to the parity check equations at each check node 320 to compute an initial syndrome, the results of which are stored in the respective check node bits 322. As described above, the respective stability bits 324 are initialized to a stable (i.e., equal to check node bits) value.

Further, a register is preloaded with an initial syndrome weight which is set to a high value.

At operation 515 a bit flipping threshold, referred to in FIG. 5 as Beta, is determined from the syndrome weight. For example, Beta may be determined as an entry in a look-up table that is addressed by the syndrome weight. The values for the entry may be chosen by running experiments with different values. The most basic way to choose a value of Beta is to count the number of check nodes that are coupled to a variable node (i.e. the variable node degree) and find the sum of the 2-bit values when half of these check nodes are stable 1 and half of these check nodes are stable 0. In other words, Beta can be calculated as the variable node degree multiplied by 1.5. The rationale is that when there are more 1 s than 0 s, the 1 s constituting a majority, the codeword bit coupled to the variable node should be flipped. When the syndrome weight is higher, it indicates that there are more bit errors in the codeword, and we want a larger majority before we flip a codeword bit. Therefore, higher values of Beta are chosen for higher syndrome weights. Moreover, since the sum of the 2-bit check node values pertaining to each variable node depends on the variable node degree, several variables of Beta, one for each value of the variable node degree, may be used in the bit-flipping algorithm for an irregular LDPC code, where variable nodes have different degrees in the Tanner graph.

Once the codeword is loaded into the variable nodes the check node bits 322 and the stability bits 324 in the check nodes 320 are updated. Then the syndrome weight is updated. Then for each variable node, if the sum of the 2-bit values in the connected check nodes is greater than or equal to Beta, the codeword bit that is coupled to the variable node is flipped. The check nodes, the syndrome weight, and the variable nodes may be updated on a periodic basis, e.g., every few clock cycles. The update cycle for the check nodes, the syndrome weight, and the variable nodes may be shorter than a time required to complete an iteration of the operations implemented by low-complexity LDPC decoder 210 depicted in FIG. 5.

If, at operation 525 it is determined that all of the check node bits 322 in all of the check nodes 320 are zero, indicating that there were no uncorrectable read errors in the codeword data, then control passes to operation 530 and the low-complexity LDPC decoder 210 exits with a success code on line 220. In response to the success code the controller 142 may return the read data associated with the codeword to the memory controller 122. By contrast, if at operation 525 it is determined that any of the check bits is non-zero, indicating that there are one or more read errors in the codeword data, then control passes to operation 535.

If, at operation 535, it is determined that the low-complexity LDPC decoder 210 has reached a limit on the number of iterations then control passes to operation 540 and the low-complexity LDPC decoder 210 exits with a failure code on line 220. In response to the failure code generated at operation 540 the controller 142 may return a read error to the memory controller 122.

For example, the limit on the number of iterations may be configured using a firmware-accessible register. It remains static for the duration of the bit-flipping algorithm. Alternatively, it can be fixed to constant number, such as 20. By contrast, if at operation 535 it is determined that the low-complexity LDPC decoder 210 has not reached a limit on the number of iterations then control passes to operation 545.

If, at operation 545, it is determined that the syndrome weight exceeds a ceiling then control passes to operation 540 and the low-complexity LDPC decoder 210 exits with a failure code on line 220. In response to the failure code generated at operation 540 the controller 142 may return a read error to the memory controller 122.

For example, the syndrome weight ceiling may be configured using firmware-accessible register. It is static for the duration of the bit-flipping algorithm. Alternatively, it can be fixed to a constant number, such as 2 times the number of check nodes. By contrast, if at operation 545 it is determined that the low-complexity LDPC decoder 210 has not reached a syndrome weight ceiling then control passes to operation 550.

If, at operation 550, it is determined that one or more bits in the variable nodes were flipped or that the value of Beta has changed in a predetermined number of cycles then control passes back to operation 515. By contrast, if at operation 550 no bits were flipped and the value of Beta has not changed then control passes to operation 555. For example, the number of cycles here can be the number of clock cycles required to complete an entire iteration, i.e. updating every check node and variable node. In another example, the number of cycles can be arbitrarily set to 10 clock cycles. The number of clock cycles is static for the duration of the bit-flipping algorithm.

If, at operation 555, it is determined that Beta has not reached a minimum stable value then control passes to operation 560 and Beta is decremented, e.g., by one (1). Control then passes back to operation 515.

By contrast, if at operation 550 no bits were flipped and the value of Beta has not changed then control passes to operation 565 and an unstable value of Beta is used for one iteration or until a codeword bit is flipped. For example, an unstable Beta may be a value lower than the variable node degree multiplied by 1.5. The use of an unstable Beta allows a marginal variable node (i.e., variable nodes that are near the majority voting limit) to flip at the expense of introducing additional errors.

Control then passes back to operation 515 and a new value of Beta is determined from the syndrome weight from a look-up table. However, if the new value of Beta is higher than the current value of Beta, Beta keeps its current value.

Thus, the operations depicted in FIG. 5 enable the low-complexity LDPC decoder 210 to implement a decoding operation which utilizes a variable bit flipping threshold which is varied as a function of the syndrome weight.

Figure 6:
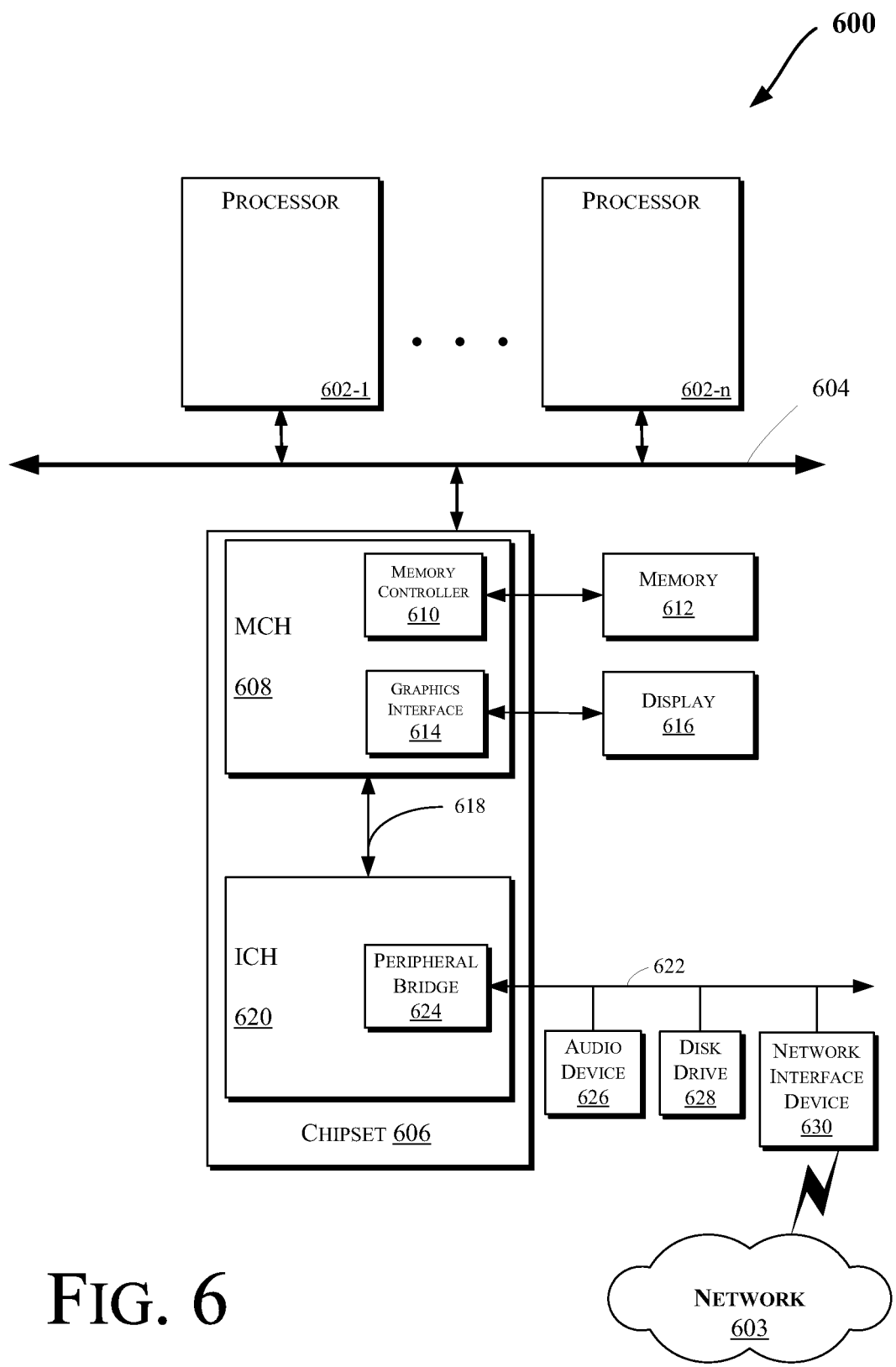
FIGS. 6-10 are schematic, block diagram illustrations of electronic devices which may be adapted to implement memory latency management in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (processors) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1.

A chipset 606 may also communicate with the interconnection network 604. The chipset 606 may include a memory control hub (MCH) 608. The MCH 608 may include a memory controller 610 that communicates with a memory 612. The memory 412 may store data, including sequences of instructions, that may be executed by the processor 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processors and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
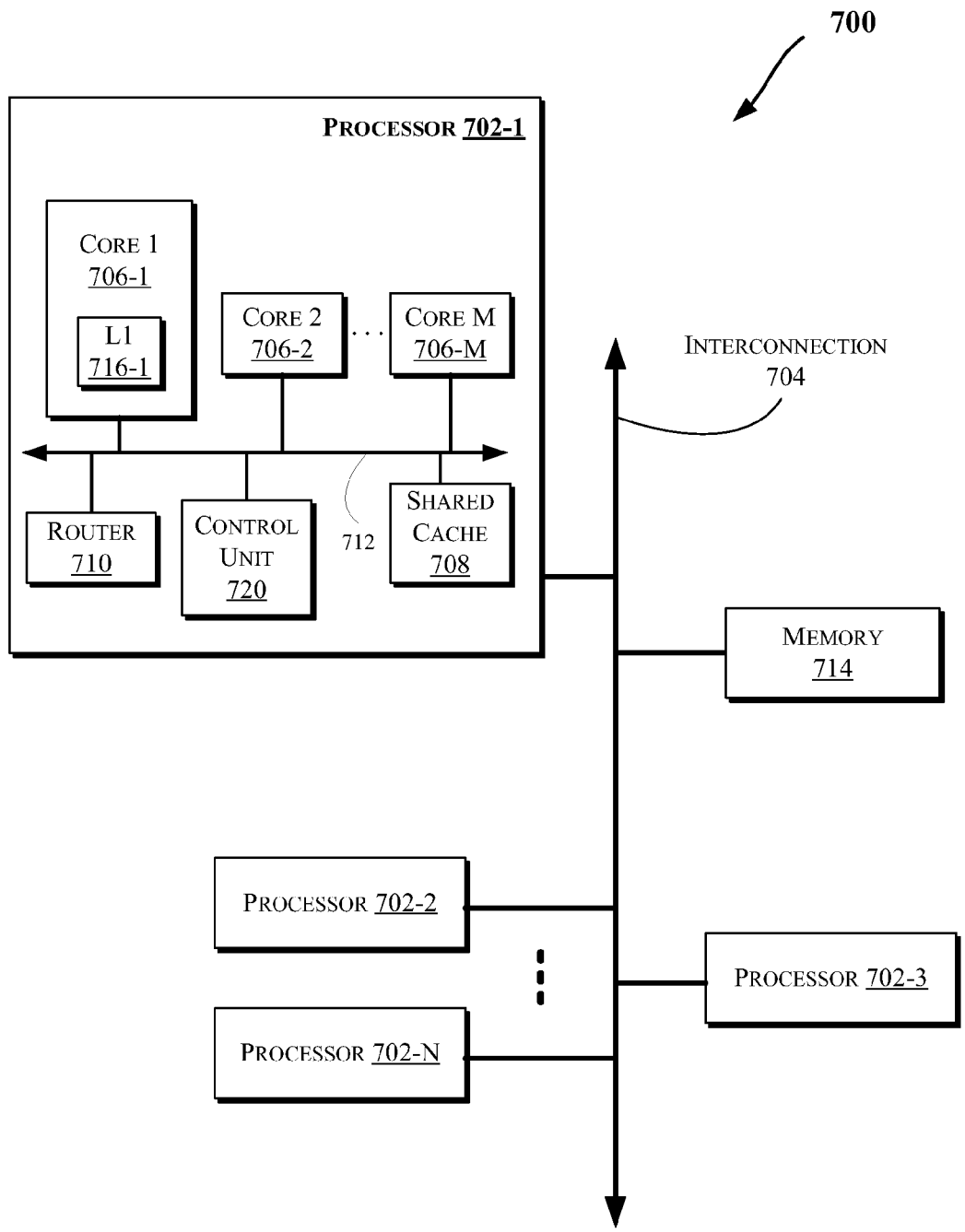

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716").

Figure 8:
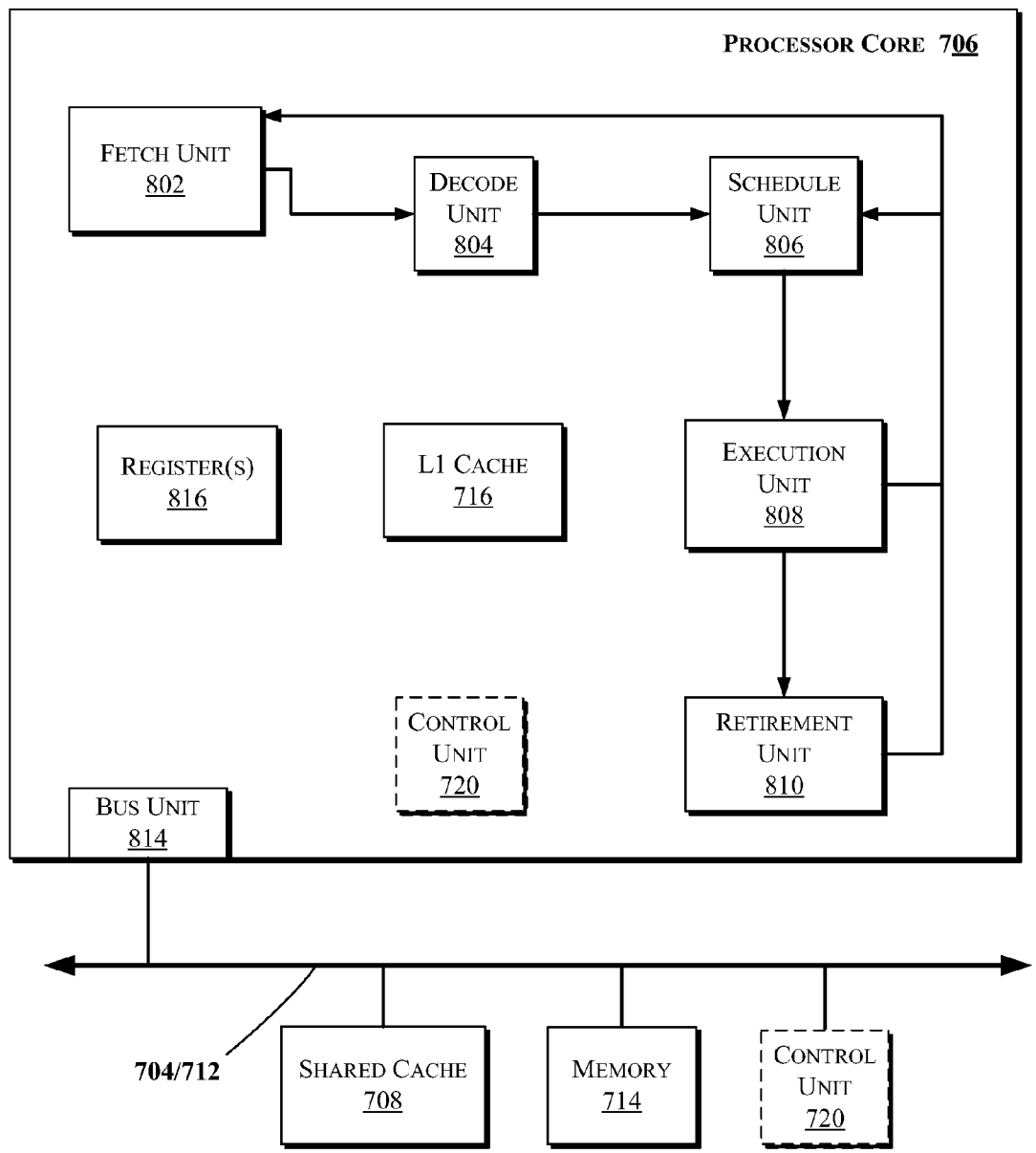

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
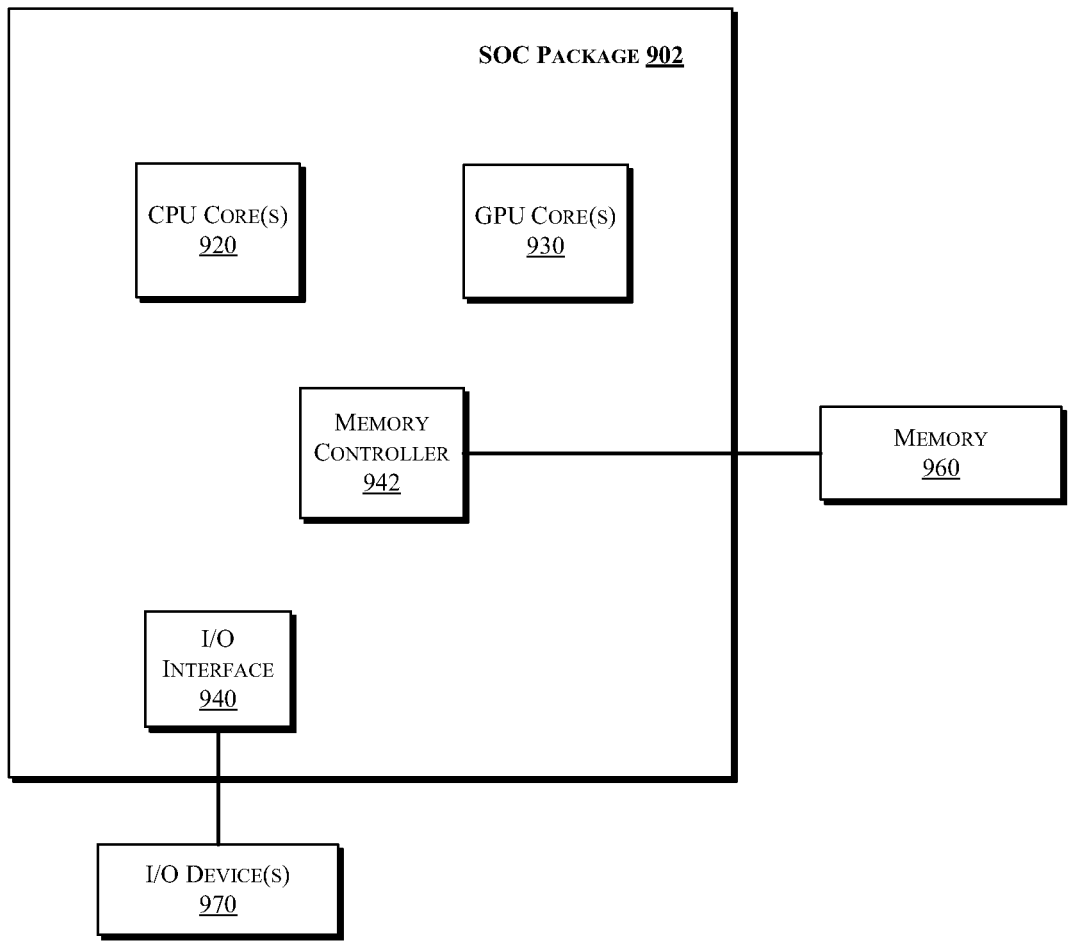

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more processor cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
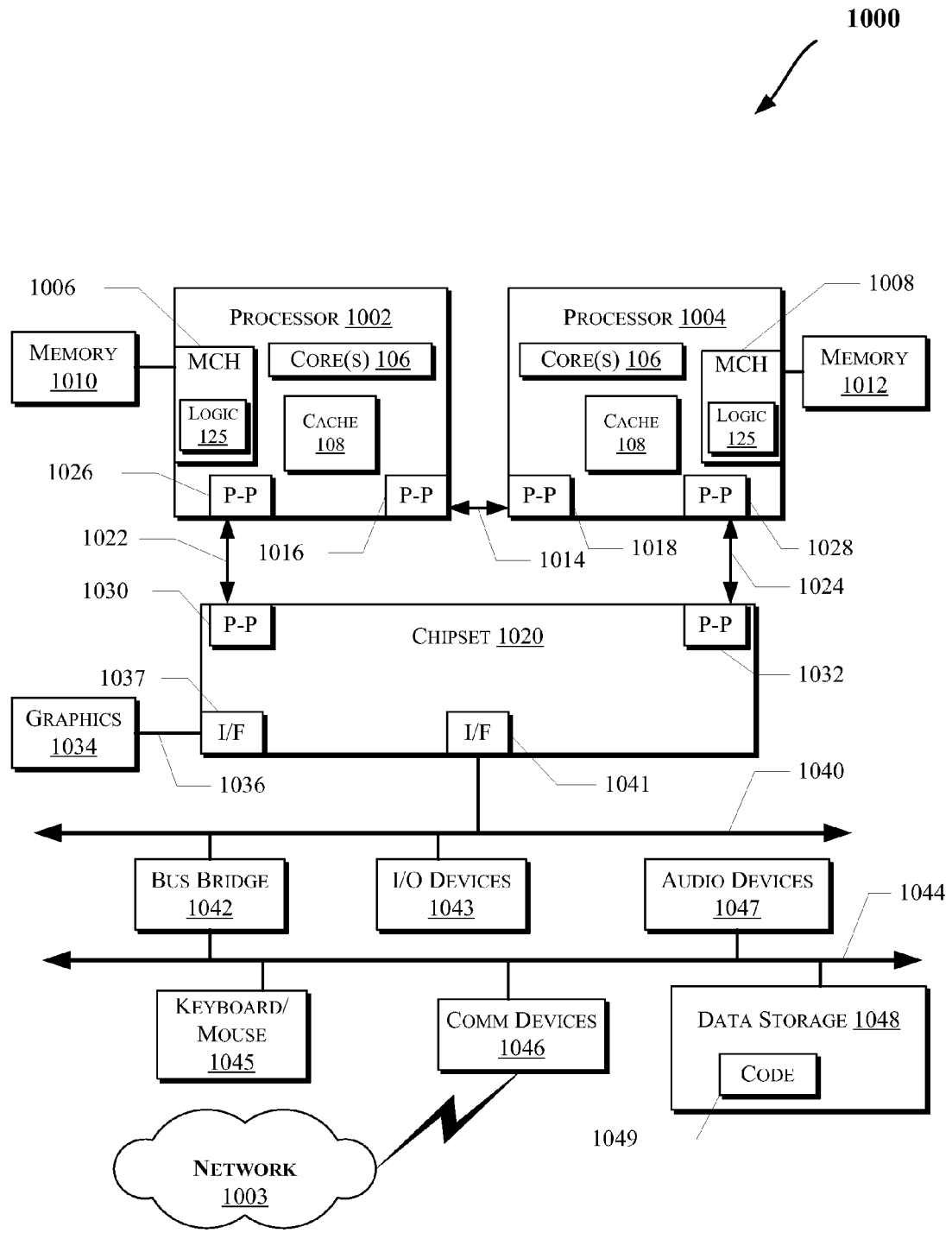

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1002 and 1004. Other embodiments of the invention, however, may exist in other circuits, logic units, or devices within the system 1000 of FIG. 10. Furthermore, other embodiments of the invention may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 803), audio I/O device, and/or a data storage device 1048. The data storage device 1048 (which may be a hard disk drive or a NAND flash based solid state drive) may store code 1049 that may be executed by the processors 1002 and/or 1004.

The following examples pertain to further embodiments.

Example 1 is a controller comprising logic to load an error correction codeword retrieved from a memory, and apply a first error correction decoder to decode the error correction codeword, wherein the first error correction decoder implements a bit-flipping error correction algorithm which utilizes a variable bit-flipping threshold to determine whether to flip a bit in an error correction codeword In Example 2, the subject matter of Example 1 can optionally include an arrangement in which the error correction decoder stores a check node bit and a stability bit for each check node, wherein the check node bit indicates whether a parity check equation passes, and the stability bit indicates whether the check node bit has been flipped.

In Example 3, the subject matter of any one of Examples 1-2 can optionally include logic to change the stability bit from a stable value to an unstable value in response to a change in a check node coupled to the stability bit.

In Example 4, the subject matter of any one of Examples 1-3 can optionally include logic to determine an initial syndrome when the error correction codeword is loaded, and set a syndrome weight to an initial value.

In Example 5, the subject matter of any one of Examples 1-4 can optionally include logic to vary the bit-flipping threshold as a function of the syndrome weight.

In Example 6, the subject matter of any one of Examples 1-5 can optionally include logic to progressively lower the bit flipping threshold in response to at least one of a change in a codeword bit or a change in the syndrome weight.

In Example 7, the subject matter of any one of Examples 1-6 can optionally include logic to determine whether the bit flipping threshold has reached a minimum stable value, and in response to a determination that the bit flipping threshold has reached a minimum stable value, to implement a single iteration of the error correction decoder using an unstable value of the bit flipping threshold.

In Example 8, the subject matter of any one of Examples 1-7 can optionally include logic to compute an updated value of the bit flipping threshold from the syndrome weight.

In Example 9, the subject matter of any one of Examples 1-8 can optionally include logic to return a signal indicating a decode success in response to a determination that all of the check node bits are zero.

In Example 10, the subject matter of any one of Examples 1-9 can optionally include logic to return a signal indicating a decode failure in response to a determination that the error correction decoder has reached a limit on the number of iterations or the syndrome weight has exceeded a ceiling.

Example 11 is a memory comprising at least one memory device; and controller comprising logic to load an error correction codeword retrieved from the memory and apply a first error correction decoder to decode the error correction codeword, wherein the first error correction decoder implements a bit-flipping error correction algorithm which utilizes a variable bit-flipping threshold to determine whether to flip a bit in an error correction codeword.

In Example 12, the subject matter of Example 11 can optionally include an arrangement in which the error correction decoder stores a check node bit and a stability bit for each check node, wherein the check node bit indicates whether a parity check equation passes, and the stability bit indicates whether the check node bit has been flipped.

In Example 13, the subject matter of any one of Examples 11-12 can optionally include logic to change the stability bit from a stable value to an unstable value in response to a change in a check node coupled to the stability bit.

In Example 14, the subject matter of any one of Examples 11-13 can optionally include logic to determine an initial syndrome when the error correction codeword is loaded, and set a syndrome weight to an initial value.

In Example 15, the subject matter of any one of Examples 11-14 can optionally include logic to vary the bit-flipping threshold as a function of the syndrome weight.

In Example 16, the subject matter of any one of Examples 11-15 can optionally include logic to progressively lower the bit flipping threshold in response to at least one of a change in a codeword bit or a change in the syndrome weight.

In Example 17, the subject matter of any one of Examples 11-16 can optionally include logic to determine whether the bit flipping threshold has reached a minimum stable value, and in response to a determination that the bit flipping threshold has reached a minimum stable value, to implement a single iteration of the error correction decoder using an unstable value of the bit flipping threshold.

In Example 18, the subject matter of any one of Examples 11-17 can optionally include logic to compute an updated value of the bit flipping threshold from the syndrome weight.

In Example 19, the subject matter of any one of Examples 11-18 can optionally include logic to return a signal indicating a decode success in response to a determination that all of the check node bits are zero.

Example 21 is an electronic device comprising a processor and a controller comprising logic to load an error correction codeword retrieved from a memory and apply a first error correction decoder to decode the error correction codeword, wherein the first error correction decoder implements a bit-flipping error correction algorithm which utilizes a variable bit-flipping threshold to determine whether to flip a bit in an error correction codeword.

In Example 22, the subject matter of Example 21 can optionally include an arrangement in which the error correction decoder stores a check node bit and a stability bit for each check node, wherein the check node bit indicates whether a parity check equation passes, and the stability bit indicates whether the check node bit has been flipped.

In Example 23, the subject matter of any one of Examples 21-22 can optionally include logic to change the stability bit from a stable value to an unstable value in response to a change in a check node coupled to the stability bit.

In Example 24, the subject matter of any one of Examples 21-23 can optionally include logic to determine an initial syndrome when the error correction codeword is loaded, and set a syndrome weight to an initial value.

In Example 25, the subject matter of any one of Examples 21-24 can optionally include logic to vary the bit-flipping threshold as a function of the syndrome weight.

In Example 26, the subject matter of any one of Examples 21-25 can optionally include logic to progressively lower the bit flipping threshold in response to at least one of a change in a codeword bit or a change in the syndrome weight.

In Example 27, the subject matter of any one of Examples 21-26 can optionally include logic to determine whether the bit flipping threshold has reached a minimum stable value, and in response to a determination that the bit flipping threshold has reached a minimum stable value, to implement a single iteration of the error correction decoder using an unstable value of the bit flipping threshold.

In Example 28, the subject matter of any one of Examples 21-27 can optionally include logic to compute an updated value of the bit flipping threshold from the syndrome weight.

In Example 29, the subject matter of any one of Examples 21-28 can optionally include logic to return a signal indicating a decode success in response to a determination that all of the check node bits are zero.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A controller comprising logic to:
load an error correction codeword retrieved from a memory;
apply a first error correction decoder to:
decode the error correction codeword;
implement a bit-flipping error correction algorithm which utilizes a variable bit-flipping threshold to determine whether to flip a bit in an error correction codeword; and
store a check node bit and a stability bit for each check node, wherein:
the check node bit indicates whether a parity check equation passes; and
the stability bit indicates whether the check node bit has been flipped.

2. The controller of claim 1, further comprising logic to:
change the stability bit from a stable value to an unstable value in response to a change in a check node coupled to the stability bit.

3. The controller of claim 1, further comprising logic to:
determine an initial syndrome when the error correction codeword is loaded; and
set a syndrome weight to an initial value.

4. The controller of claim 3, further comprising logic to:
vary the bit-flipping threshold as a function of the syndrome weight.

5. The controller of claim 3, further comprising logic to:
progressively lower the bit flipping threshold in response to at least one of:
a change in a codeword bit; or
a change in the syndrome weight.

6. The controller of claim 3, further comprising logic to:
determine whether the bit flipping threshold has reached a minimum stable value, and in response to a determination that the bit flipping threshold has reached a minimum stable value, to:
implement a single iteration of the error correction decoder using an unstable value of the bit flipping threshold.

7. The controller of claim 6, further comprising logic to:
compute an updated value of the bit flipping threshold from the syndrome weight.

8. The controller of claim 7, further comprising logic to:
return a signal indicating a decode success in response to a determination that all of the check node bits are zero.

9. The controller of claim 7, further comprising logic to:
return a signal indicating a decode failure in response to a determination that:
the error correction decoder has reached a limit on the number of iterations; or
the syndrome weight has exceeded a ceiling.

10. A memory, comprising:
at least one memory device; and
a controller comprising logic to:
load an error correction codeword retrieved from the memory;
apply a first error correction decoder to:
decode the error correction codeword;
implement a bit-flipping error correction algorithm which utilizes a variable bit-flipping threshold to determine whether to flip a bit in an error correction codeword; and
store a check node bit and a stability bit for each check node, wherein:
the check node bit indicates whether a parity check equation passes; and
the stability bit indicates whether the check node bit has been flipped.

11. The memory of claim 10, wherein the controller further comprises logic to:
change the stability bit from a stable value to an unstable value in response to a change in a check node coupled to the stability bit.

12. The memory of claim 10, wherein the controller further comprises logic to:
determine an initial syndrome when the error correction codeword is loaded; and
set a syndrome weight to an initial value.

13. The memory of claim 12, wherein the controller further comprises logic to:
vary the bit-flipping threshold as a function of the syndrome weight.

14. The memory of claim 12, wherein the controller further comprises logic to:
progressively lower the bit flipping threshold in response to at least one of:
a change in a codeword bit; or
a change in the syndrome weight.

15. The memory of claim 12, wherein the controller further comprises logic to:
determine whether the bit flipping threshold has reached a minimum stable value, and in response to a determination that the bit flipping threshold has reached a minimum stable value, to:
implement a single iteration of the error correction decoder using an unstable value of the bit flipping threshold.

16. The memory of claim 15, wherein the controller further comprises logic to:
compute an updated value of the bit flipping threshold from the syndrome weight.

17. The memory of claim 16, wherein the controller further comprises logic to:
return a signal indicating a decode success in response to a determination that all of the check node bits are zero.

18. The memory of claim 16, wherein the controller further comprises logic to:
return a signal indicating a decode failure in response to a determination that:
the error correction decoder has reached a limit on the number of iterations; or
the syndrome weight has exceeded a ceiling.

19. An electronic device comprising:
a processor; and
a controller comprising logic to:
load an error correction codeword retrieved from a memory
apply a first error correction decoder to:
decode the error correction codeword,
implement a bit-flipping error correction algorithm which utilizes a variable bit-flipping threshold to determine whether to flip a bit in an error correction codeword; and store a check node bit and a stability bit for each check node, wherein:
the check node bit indicates whether a parity check equation passes; and
the stability bit indicates whether the check node bit has been flipped.

20. The electronic device of claim 19, further comprising logic to:
change the stability bit from a stable value to an unstable value in response to a change in a check node coupled to the stability bit.

21. The electronic device of claim 19, further comprising logic to:
determine an initial syndrome when the error correction codeword is loaded; and
set a syndrome weight to an initial value.

22. The electronic device of claim 21, further comprising logic to:
vary the bit-flipping threshold as a function of the syndrome weight.

* * * * *